United States Patent
Ding et al.

(10) Patent No.: US 9,843,317 B2
(45) Date of Patent: Dec. 12, 2017

(54) METHOD AND DEVICE FOR PROCESSING PWM DATA

(71) Applicant: Xiaomi Inc., Beijing (CN)

(72) Inventors: Yi Ding, Beijing (CN); Xin Liu, Beijing (CN); Ziguang Gao, Beijing (CN)

(73) Assignee: XIAOMI INC., Haidian District, Beijing (CN)

( * ) Notice: Subject to any disclaimer, the term of this patent is extended or adjusted under 35 U.S.C. 154(b) by 115 days.

(21) Appl. No.: 14/704,940

(22) Filed: May 5, 2015

(65) Prior Publication Data

US 2016/0079973 A1 Mar. 17, 2016

Related U.S. Application Data

(63) Continuation of application No. PCT/CN2015/071872, filed on Jan. 30, 2015.

(30) Foreign Application Priority Data

Sep. 15, 2014 (CN) .......................... 2014 1 0469463

(51) Int. Cl.
*H03K 3/017* (2006.01)
*H03K 7/08* (2006.01)
*H03K 5/19* (2006.01)

(52) U.S. Cl.
CPC ............... *H03K 7/08* (2013.01); *H03K 5/19* (2013.01)

(58) Field of Classification Search
CPC B23K 2203/50; B23K 26/0057; B23K 26/40; B23K 2201/40
See application file for complete search history.

(56) References Cited

U.S. PATENT DOCUMENTS

2003/0086488 A1 5/2003 Joe et al.
2006/0274872 A1 12/2006 Ikeda et al.
(Continued)

FOREIGN PATENT DOCUMENTS

CN 1771661 A 5/2006
CN 1954495 A 4/2007
(Continued)

OTHER PUBLICATIONS

Il-Kyu Hwang et al.: "Home network configuring scheme for all electric appliances using ZigBee-based integrated remote controller", IEEE Transactions on Consumer Electronics, vol. 55, No. 3, Aug. 1, 2009 (Aug. 1, 2009), pp. 1300-1307.
(Continued)

*Primary Examiner* — Sibin Chen
(74) *Attorney, Agent, or Firm* — Jun He Law Offices P.C.; James J. Zhu

(57) ABSTRACT

The present disclosure provides a method and a device for processing PWM data, so as to reduce the size of the PWM data. The method includes: dividing pulse widths in the PWM data into at least one pulse width group; determining a convergence pulse width for each of the at least one pulse width group, herein each of the at least one pulse width group converges around a same pulse width, respectively; replacing each of the at least one pulse width group with the corresponding convergence pulse width; and representing the PWM data by using the convergence pulse widths. Through the technical solution, the size of the PWM data may be reduced, transmission speed of the PWM data may be improved, and the space for storing the PWM data may be decreased.

20 Claims, 5 Drawing Sheets

(56) References Cited

U.S. PATENT DOCUMENTS

| | | | |
|---|---|---|---|
| 2009/0168919 A1 | 7/2009 | Sato et al. | |
| 2009/0214225 A1 | 8/2009 | Nakagawa et al. | |
| 2010/0212975 A1* | 8/2010 | Moon .................. | G06F 3/0418 178/18.06 |
| 2011/0286542 A1 | 11/2011 | Shelburne | |

FOREIGN PATENT DOCUMENTS

| | | |
|---|---|---|
| CN | 1976227 A | 6/2007 |
| CN | 101123035 A | 2/2008 |
| CN | 101257467 A | 9/2008 |
| CN | 101414438 A | 4/2009 |
| CN | 102129769 A | 7/2011 |
| CN | 102855744 A | 1/2013 |
| CN | 202710718 U | 1/2013 |
| CN | 103226889 A | 7/2013 |
| CN | 103457583 A | 12/2013 |
| JP | 2007174116 A | 7/2007 |
| JP | 2010160093 A | 7/2010 |
| KR | 10-0153997 B1 | 11/1998 |
| RU | 2116694 C1 | 7/1998 |

OTHER PUBLICATIONS

EESR Search Report for 15184945.2.
International Search Report for PCT/CN2015/071872.

\* cited by examiner

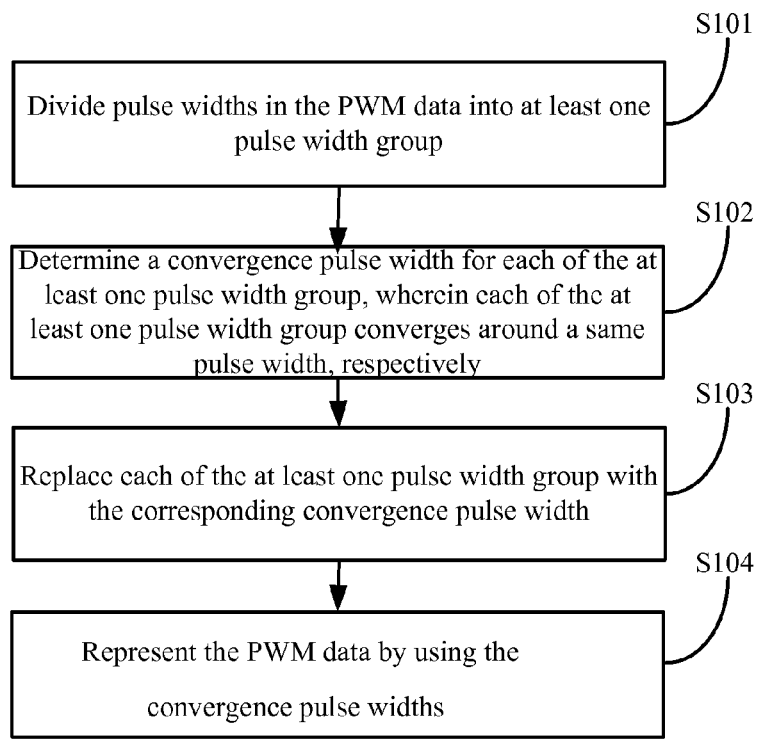

METHOD AND DEVICE FOR PROCESSING PWM DATA

CROSS-REFERENCE TO RELATED APPLICATIONS

This application is a Continuation application of International Application No. PCT/CN2015/071872, filed Jan. 30, 2015, which is based upon and claims priority to Chinese Patent Application No. CN201410469463.2, filed Sep. 15, 2014, the entire contents of which are incorporated herein by reference.

TECHNICAL FIELD

The present disclosure generally relates to the field of coding technology, and more particularly, to a method and a device for processing PWM data.

BACKGROUND

Most home appliances have infrared interfaces, and through IR learning, control instructions of various home appliances may be copied conveniently. The principle of IR learning is to record the waveform widths of the transmitting infrared signals. This method may replay infrared signals in any coding form. However, since an infrared signal has a relatively long waveform, and the size of the data may be rather large, thus creating problems in the transmission and storage of the learned data.

Currently, a common infrared signal utilizes the Pulse Width Modulation (PWM) encoding technique to generate waveform data, i.e. PWM data. The signals propagated by the PWM in lower layers are digital signals, expressed in a waveform of 0/1. Theoretically, through the PWM, data is transmitted by means of combinations of a limited amount of waveforms each with a certain length in the lowermost layer.

SUMMARY

According to a first aspect of embodiments of the present disclosure, a method for processing PWM data is provided. The method includes: dividing pulse widths in the PWM data into at least one pulse width group; determining a convergence pulse width for each of the at least one pulse width group, herein each of the at least one pulse width group converges around a same pulse width, respectively; replacing each of the at least one pulse width group with the corresponding convergence pulse width; and representing the PWM data by using the convergence pulse widths.

According to a second aspect of embodiments of the present disclosure, a device for processing PWM data is provided. The device includes a processor and a memory for storing instructions executable by the processor. The processor is configured to perform: dividing pulse widths in the PWM data into at least one pulse width group; determining a convergence pulse width for each of the at least one pulse width group, herein each of the at least one pulse width group converges around a same pulse width, respectively; replacing each of the at least one pulse width group with the corresponding convergence pulse width; and representing the PWM data by using the convergence pulse widths.

According to a third aspect of embodiments of the present disclosure, a non-transitory computer readable storage medium is provided, when instructions in the storage medium are executed by a processor of a device, the device is caused to execute the following steps of: dividing pulse widths in the PWM data into at least one pulse width group; determining a convergence pulse width for each of the at least one pulse width group, herein each of the at least one pulse width group converges around a same pulse width, respectively; replacing each of the at least one pulse width group with the corresponding convergence pulse width; and representing the PWM data by using the convergence pulse widths.

It is to be understood that both the foregoing general description and the following detailed description are exemplary and explanatory only and are not restrictive of the invention.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

FIG. 1 is a flow chart of a method for processing PWM data, according to an exemplary embodiment.

FIG. 2 is an illustrative drawing for the pulse-width coordinate, according to an exemplary embodiment.

DESCRIPTION OF THE EMBODIMENTS

Figure 3:
FIG. 3 is an illustrative drawing for the pulse-width coordinate, according to an exemplary embodiment.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

FIG. 1 is a flow chart of a method for processing PWM data, according to an exemplary embodiment. The method may be applied in a PWM data receiving device. The receiving device may be terminal devices, and may also be a server. Referring to FIG. 1, the method includes steps S101-S104.

In step S101, pulse widths in the PWM data are divided into at least one pulse width group.

In step S102, a convergence pulse width is determined for each of the at least one pulse width group, respectively. In this case, each of the at least one pulse width group converges around a same pulse width.

Generally, pulse widths in PWM data have a characteristic that they are close to some standard values but distributed randomly. On a coordinate in a one-dimensional form, these pulse widths gather around the standard values (as illustrated in FIG. 2). Herein, such pulse widths gathering around a standard value are referred to as a pulse width group converging around a same pulse width. Moreover, the standard is referred to as a convergence pulse width for the pulse width group. There may exists at least one pulse width group in the PWM data and each of the at least one pulse width group converges around a same pulse width, respectively.

In step S103, each of the at least one pulse width group is replaced with the corresponding convergence pulse width.

Generally, pulse widths in the original PWM data only have a few standard values, for example, 1025 ms, 575 ms and so on. Due to errors in the process of sending, transmitting and receiving the PWM data, pulse widths in the PWM data are not consistent with the standard values. In the technical solutions of the present disclosure, in view that pulse widths converging around a same pulse width are actually pulse widths converging around a standard value, a corresponding convergence pulse width is taken as a standard value, and the pulse widths in the PWM data may be standardized and normalized by representing the pulse widths converging around the corresponding same pulse width with the corresponding convergence pulse width.

In step S104, the PWM data is represented by using the convergence pulse widths. In an exemplary embodiment, the step S104 may include following sub-steps.

For example, in a sub-step of S104, a pulse-width query table which contains an index for each of the convergence pulse widths is generated and the PWM data is represented by using the indexes in the pulse-width query table.

Generally, since the number of the standard values of the pulse widths is relatively small, correspondingly, the number of the convergence pulse width is relatively small, such as 5, 8 and other limited sizes. Therefore, each of the generated convergence pulse widths may be added to a pulse-width query table, and the PWM data may be represented by indexes of the pulse widths in the pulse-width query table. For example, the pulse-width query table may be a 16-square query table. In this case, a piece of data occupying 16 bits may be stored with 4 bits, reducing the size of the PWM data to ¼ of its original size.

Through the technical solutions provided by embodiments of the present disclosure, by utilizing a characteristic that pulse widths in the PWM data tend to converge to some standard values, the PWM data is standardized and normalized, and a pulse-width query table is generated, and the PWM data is represented by each index of each pulse width in the pulse-width query table. In this way, the size of the PWM data may be reduced, transmission speed of the PWM data may be improved, and the space for storing the PWM data may be decreased. Moreover, the binary coding of the data may be restored desirably, which facilitates implementation of code identification.

In an embodiment, the step S102 may be performed as the steps A1-A4.

In step A1, each pulse width in the PWM data is marked on a pulse-width coordinate. The pulse-width coordinate can be a one-dimensional coordinate as illustrated in FIG. 2.

In step A2, at least one region is determined on the pulse-width coordinate and pulse widths in each region are determined as each group of the pulse widths. Herein a marking density is equal to or larger than a preset density in each region.

In step A3, an average value of the pulse widths in each region is calculated.

In an embodiment, the average value of pulse widths in each region may be calculated according to the following method: determining a number of the pulse widths in each region; calculating a total width of the pulse widths in each region; and taking a ratio of the total width against the number as the average value of the pulse widths in each region. However, the average value of the pulse widths in each region may be calculated according to other calculating methods. The calculating methods in any form are all within the protection scope of the present disclosure.

In step A4, the average value is replaced as the corresponding convergence pulse width for each of the at least one pulse width group.

For example, as illustrated in FIG. 2, a horizontal line denotes a pulse-width coordinate in a one-dimensional form, and the coordinate is provided thereon with a scale having a unit of 1 ms (the scale is not shown in the figure). The device may automatically mark the pulse widths of the PWM data on the coordinate (corresponding to the above step A1). It is assumed that the preset density is 20 pulse widths in a range of 100 ms. Based on the coordinate, it may be determined that a region [525 ms, 625 ms] is a region where a marking density is equal to or larger than the preset density (in which a same pulse width value appearing for N times is taken as N pulse widths). Then the pulse widths in the region [525 ms, 625 ms] are determined as the pulse widths converging around a same pulse width, briefly a group of convergent impulse widths (corresponding to the above step A2). Then, an average value of the pulse widths in the region [525 ms, 625 ms] is calculated. Assuming that a total width of the pulse widths in the region [525 ms, 625 ms] is X, and the number of the pulse widths in the region [525 ms, 625 ms] is 30, the average value of the pulse widths in the region [525 ms, 625 ms] may be calculated as X/30 ms (corresponding to the above step A3). Then X/30 ms is replaced as the convergence pulse width for this pulse width group (corresponding to the above step A4).

However, the convergence pulse width can also be determined by other values. For example, in an embodiment, a median value of the pulse widths in each region is selected and determined as the convergence pulse width.

In an embodiment, the length of the region above may be preset to simplify the process of calculating the convergence pulse width. For example, a difference value between a maximum value and a minimum value of the pulse widths in each region may be set to equal to a preset value, such as 100 ms, 150 ms, etc.

After the convergence pulse width is determined through the above method, due to errors in the process of sending, transmitting, and receiving the PWM data, some pulse widths may have a great difference from the original pulse width so that they are located outside the above region; or, since the length of the region is preset, some pulse widths may not be taken into consideration during the calculation of the convergence pulse width. In such cases, for each region, such pulse widths may be normalized through the following steps B1-B3.

In step B1, it is judged whether there exists an outer pulse width among the pulse widths marked on the pulse-width coordinate. In this case, the outer pulse width is a pulse width locating outside the at least one region.

In step B2, when there exists the outer pulse width, a convergence pulse width having a smallest absolute difference value with respect to the outer pulse width is selected.

In step B3, the outer pulse width is replaced with the convergence pulse width having the smallest absolute difference value with respect to the outer pulse width.

For example, as illustrated in FIG. 3, there is one pulse width 900 ms locating outside the above region on the pulse-width coordinate. Assuming that the convergence pulse width in a region 01 is 575 ms, the convergence pulse width in a region 02 is 1025 ms, then according to the above steps B1-B3, |900−1025|=125 ms, while |900−575|=325 ms, so the pulse width is replaced with 1025 ms.

In this way, each pulse width in the PWM data is standardized and normalized. Next, the steps S103-S104 are performed, the size of the PWM data may be reduced, transmission speed of the PWM data may be improved, and the space for storing the PWM data may be decreased. Moreover, the binary coding of the data may be restored desirably, which facilitates implementation of code identification.

Figure 4:
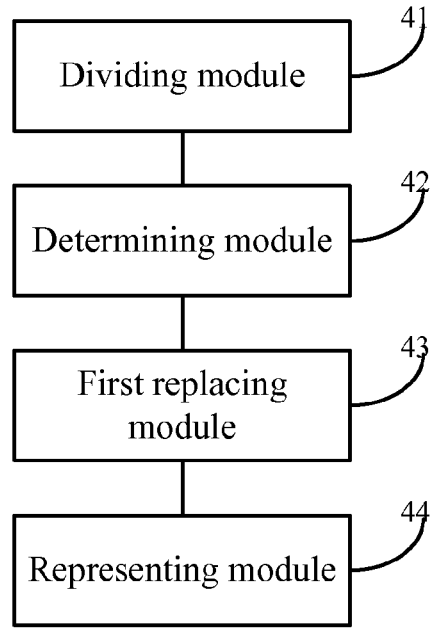
FIG. 4 is a block diagram of an apparatus for processing PWM data, according to a first exemplary embodiment.

Corresponding to the above method for processing PWM data, embodiments of the present disclosure further provide an apparatus for processing PWM data. Referring to FIG. 4, the apparatus may include: a dividing module 41 configured to divide pulse widths in the PWM data into at least one pulse width group; a determining module 42 configured to determine a convergence pulse width for each of the at least one pulse width group, herein each of the at least one pulse width group converges around a same pulse width, respectively; a first replacing module 43 configured to replace each of the at least one pulse width group with the corresponding convergence pulse width; and a representing module 44 configured to represent the PWM data by using the convergence pulse widths.

Figure 5:
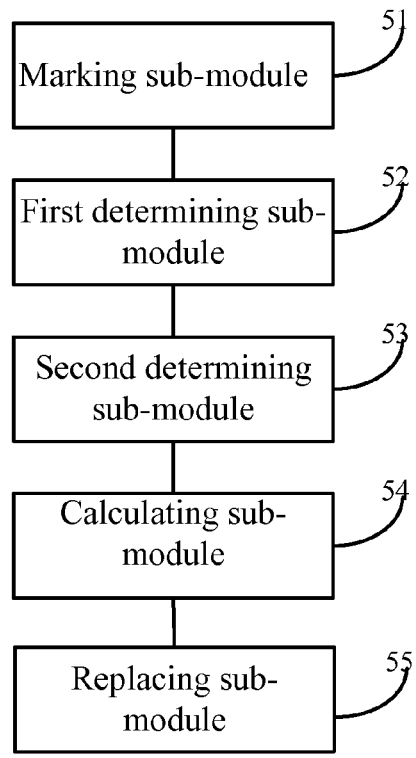
FIG. 5 is a block diagram of a determining module, according to an exemplary embodiment.

In an embodiment, referring to FIG. 5, the determining module may include: a marking sub-module 51 configured to mark each pulse width in the PWM data on a pulse-width coordinate; a first determining sub-module 52 configured to determine at least one region on the pulse-width coordinate, herein a marking density is equal to or larger than a preset density in each region; a second determining sub-module 53 configured to determine pulse widths in each region as each group of the pulse widths; a calculating sub-module 54 configured to calculate an average value of the pulse widths in each region; and a replacing sub-module 55 configured to replace the average value as the corresponding convergence pulse width for each of the at least one pulse width group.

However, in other embodiments of apparatus for processing PWM data, the calculating sub-module 54 can be configured to select a median value of the pulse widths in each region; and a replacing sub-module 55 is configured to replace the median value as the corresponding convergence pulse width for each of the at least one pulse width group.

Figure 6:
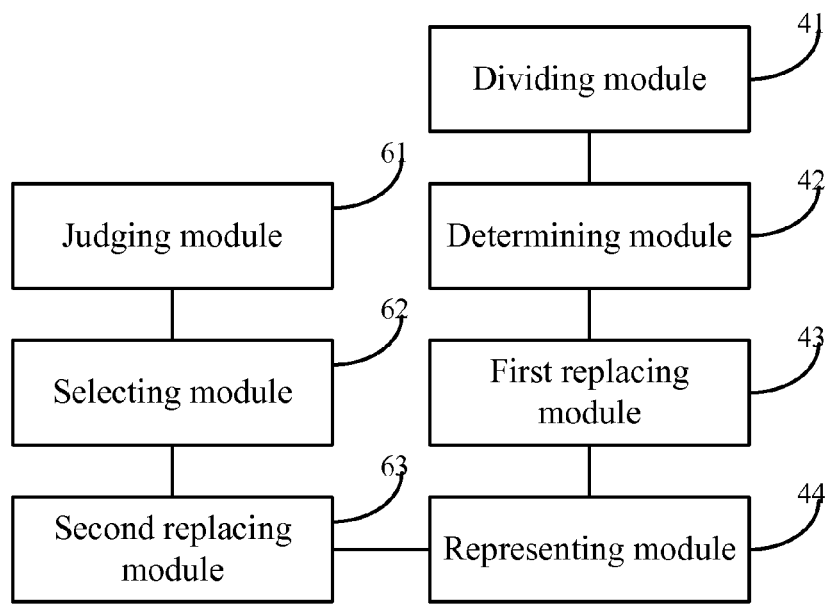
FIG. 6 is a block diagram of another for processing PWM data, according to a second exemplary embodiment.

In an embodiment, referring to FIG. 6, the apparatus may further include: a judging module 61 configured to judge whether there exists an outer pulse width among the pulse widths marked on the pulse-width coordinate, herein the outer pulse width is a pulse width locating outside the at least one region; a selecting module 62 configured to select a convergence pulse width having a smallest absolute difference value with respect to the outer pulse width when there exists the outer pulse width; and a second replacing module 63 configured to replace the outer pulse width with the convergence pulse width having the smallest absolute difference value with respect to the outer pulse width.

In an embodiment, the calculating sub-module 54 may be further configured to: determine the number of the pulse widths in each region; calculate the sum of the pulse widths in each region; and take a ratio of the sum against the number as the average value of the pulse widths in each region.

A device for processing PWM data includes a processor and a memory for storing instructions executable by the processor. And the processor is configured to perform: dividing pulse widths in the PWM data into at least one pulse width group; determining a convergence pulse width for each of the at least one pulse width group, herein each of the at least one pulse width group converges around a same pulse width, respectively; replacing each of the at least one pulse width group with the corresponding convergence pulse width; and representing the PWM data by using the convergence pulse widths.

The processor may be further configured to perform: marking each pulse width in the PWM data on a pulse-width coordinate; determining at least one region on the pulse-width coordinate, herein a marking density is equal to or larger than a preset density in each region; determining pulse widths in each region as each group of the pulse widths; calculating an average value of the pulse widths in each region; and replacing the average value as the corresponding convergence pulse width for each of the at least one pulse width group.

In an embodiment, the processor may be further configured to perform: marking each pulse width in the PWM data on a pulse-width coordinate; determining at least one region on the pulse-width coordinate, herein a marking density is equal to or larger than a preset density in each region; determining pulse widths in each region as each group of the pulse widths; selecting a median value of the pulse widths in each region; and replacing the median value as the corresponding convergence pulse width for each of the at least one pulse width group.

The processor may be further configured to perform that a difference value between a maximum value and a minimum value of the pulse widths in each region equals to a preset value.

In an embodiment, the processor may be further configured to perform: judging whether there exists an outer pulse width among the pulse widths marked on the pulse-width coordinate, herein the outer pulse width is a pulse width locating outside the at least one region; selecting a convergence pulse width having a smallest absolute difference value with respect to the outer pulse width when there exists the outer pulse width; and replacing the outer pulse width with the convergence pulse width having the smallest absolute difference value with respect to the outer pulse width.

In an embodiment, the processor may be further configured to perform: determining the number of the pulse widths in each region; calculating the sum of the pulse widths in each region; and taking a ratio of the sum against the number as the average value of the pulse widths in each region.

Figure 7:
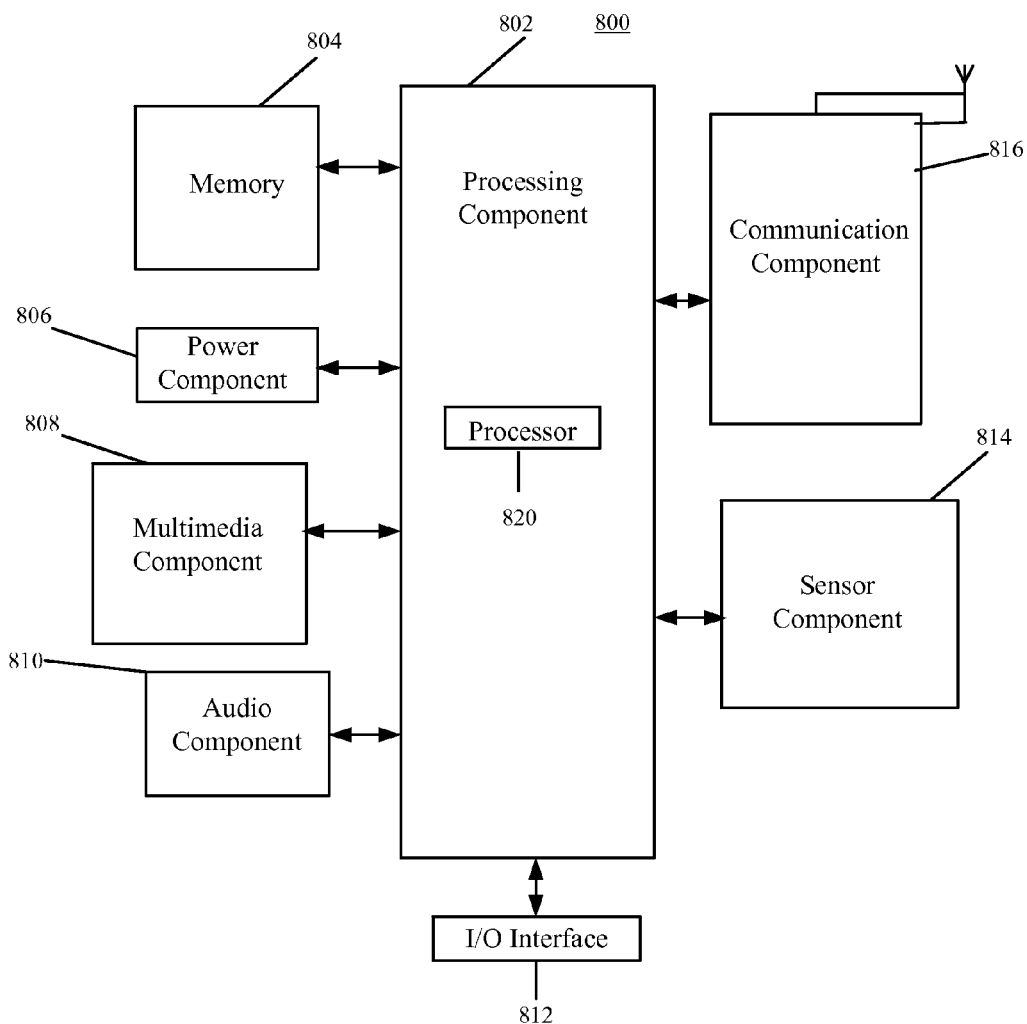
FIG. 7 is a block diagram of a device for processing PWM data, according to an exemplary embodiment.

FIG. 7 is a block diagram of a device 800 for processing PWM data, according to an exemplary embodiment. For example, the device 800 may be a mobile phone, a computer, a digital broadcast terminal, a messaging device, a gaming console, a tablet, a medical device, exercise equipment, a personal digital assistant, and the like.

Referring to FIG. 7, the device 800 may include one or more of the following components: a processing component 802, a memory 804, a power component 806, a multimedia component 808, an audio component 810, an input/output (I/O) interface 812, a sensor component 814, and a communication component 816.

The processing component 802 typically controls overall operations of the device 800, such as the operations associated with display, telephone calls, data communications, camera operations, and recording operations. The processing component 802 may include one or more processors 820 to execute instructions to perform all or part of the steps in the above described methods. Moreover, the processing component 802 may include one or more modules which facilitate the interaction between the processing component 802 and other components. For instance, the processing component 802 may include a multimedia module to facilitate the interaction between the multimedia component 808 and the processing component 802.

The memory 804 is configured to store various types of data to support the operation of the device 800. Examples of such data include instructions for any applications or methods operated on the device 800, contact data, phonebook data, messages, pictures, video, etc. The memory 804 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 806 provides power to various components of the device 800. The power component 806 may include a power management system, one or more power sources, and any other components associated with the generation, management, and distribution of power in the device 800.

The multimedia component 808 includes a screen providing an output interface between the device 800 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 808 includes a front camera and/or a rear camera. The front camera and the rear camera may receive an external multimedia datum while the device 800 is in an operation mode, such as a photographing mode or a video mode. Each of the front camera and the rear camera may be a fixed optical lens system or have focus and optical zoom capability.

The audio component 810 is configured to output and/or input audio signals. For example, the audio component 810 includes a microphone (MIC) configured to receive an external audio signal when the device 800 is in an operation mode, such as a call mode, a recording mode, and a voice recognition mode. The received audio signal may be further stored in the memory 804 or transmitted via the communication component 816. In some embodiments, the audio component 810 further includes a speaker to output audio signals.

The I/O interface 812 provides an interface between the processing component 802 and peripheral interface modules, such as a keyboard, a click wheel, buttons, and the like. The buttons may include, but are not limited to, a home button, a volume button, a starting button, and a locking button.

The sensor component 814 includes one or more sensors to provide status assessments of various aspects of the device 800. For instance, the sensor component 814 may detect an open/closed status of the device 800, relative positioning of components, e.g., the display and the keypad, of the device 800, a change in position of the device 800 or a component of the device 800, a presence or absence of user contact with the device 800, an orientation or an acceleration/deceleration of the device 800, and a change in temperature of the device 800. The sensor component 814 may include a proximity sensor configured to detect the presence of nearby objects without any physical contact. The sensor component 814 may also include a light sensor, such as a CMOS or CCD image sensor, for use in imaging applications. In some embodiments, the sensor component 814 may also include an accelerometer sensor, a gyroscope sensor, a magnetic sensor, a pressure sensor, or a temperature sensor.

The communication component 816 is configured to facilitate communication, wired or wirelessly, between the device 800 and other devices. The device 800 can access a wireless network based on a communication standard, such as WiFi, 2G, or 3G, or a combination thereof. In one exemplary embodiment, the communication component 816 receives a broadcast signal or broadcast associated information from an external broadcast management system via a broadcast channel. In one exemplary embodiment, the communication component 816 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In exemplary embodiments, the device 800 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In exemplary embodiments, there is also provided a non-transitory computer-readable storage medium including instructions, such as included in the memory 804, executable by the processor 820 in the device 800, for performing the above-described methods. For example, the non-transitory computer-readable storage medium may be a ROM, a RAM, a CD-ROM, a magnetic tape, a floppy disc, an optical data storage device, and the like.

A non-transitory computer-readable storage medium having stored therein instructions that, when executed by a processor of a mobile terminal, cause the mobile terminal to perform a method for processing PWM data, the method includes: marking each pulse width in the PWM data on a pulse-width coordinate; determining at least one region on the pulse-width coordinate, herein a marking density is equal to or larger than a preset density in each region; determining pulse widths in each region as each group of the pulse widths; calculating an average value of the pulse widths in each region; and replacing the average value as the corresponding convergence pulse width for each of the at least one pulse width group.

In this case, a difference value between a maximum value and a minimum value of the pulse widths in each region equals to a preset value.

In an embodiment, the convergence pulse width for the pulse width group can also be determined by other values. For example, in an embodiment, a median value of the pulse widths in each region is calculated and determined as the convergence pulse width for the corresponding pulse width group.

The method may further include: judging whether there exists an outer pulse width among the pulse widths marked on the pulse-width coordinate, herein the outer pulse width is a pulse width locating outside the at least one region; selecting a convergence pulse width having a smallest absolute difference value with respect to the outer pulse width when there exists the outer pulse width; and replacing the outer pulse width with the convergence pulse width having the smallest absolute difference value with respect to the outer pulse width.

Figure 8:
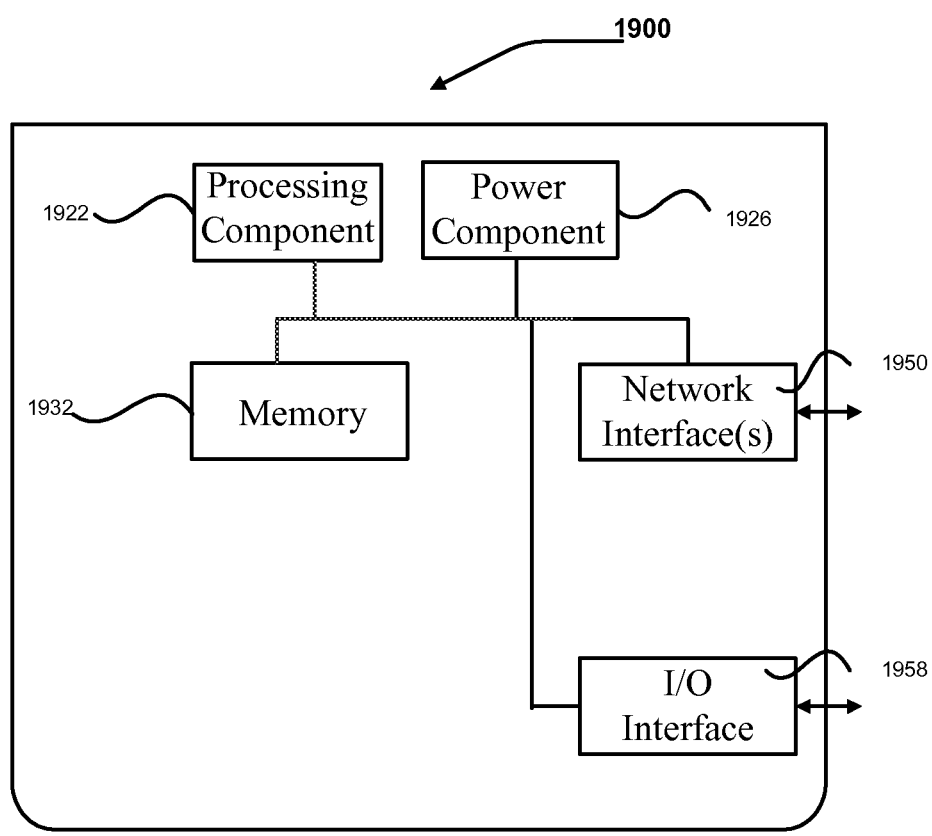
FIG. 8 is a block diagram of another device for processing PWM data, according to another exemplary embodiment.

FIG. 8 is a block diagram of another device 1900 for processing PWM data, according to another exemplary embodiment. For example, the device 1900 may be provided as a server. Referring to FIG. 8, the device 1900 includes a processing component 1922 that further includes one or more processors, and memory resources represented by a memory 1932 for storing instructions executable by the processing component 1922, such as application programs. The application programs stored in the memory 1932 may include one or more modules each corresponding to a set of instructions. Further, the processing component 1922 is configured to execute the instructions to perform the above described method for processing PWM data.

The device 1900 may also include a power component 1926 configured to perform power management of the device 1900, wired or wireless network interface(s) 1950 configured to connect the device 1900 to a network, and an input/output (I/O) interface 1958. The device 1900 may operate based on an operating system stored in the memory 1932, such as Windows Server™, Mac OS X™, Unix™, Linux™, FreeBSD™, or the like.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. A method for processing PWM (Pulse Width Modulation) data, comprising:
   dividing pulse widths in the PWM data into at least one pulse width group;
   determining a convergence pulse width for each of the at least one pulse width group, wherein each of the at least one pulse width group converges around a same pulse width, respectively;
   replacing each of the at least one pulse width group with the corresponding convergence pulse width; and
   representing the PWM data by using the convergence pulse widths.

2. The method according to claim 1, wherein representing the PWM data by using the convergence pulse widths comprises:
   generating a pulse-width query table which contains an index for each of the convergence pulse widths; and
   representing the PWM data by using the indexes in the pulse-width query table.

3. The method according to claim 1, wherein determining the convergence pulse width for each of the at least one pulse width group comprises:
   marking each pulse width in the PWM data on a pulse-width coordinate;
   determining at least one region on the pulse-width coordinate, wherein a marking density is equal to or larger than a preset density in each region;
   determining pulse widths in each region as each group of the pulse widths;
   calculating an average value of the pulse widths in each region; and
   replacing the average value as the corresponding convergence pulse width for each of the at least one pulse width group.

4. The method according to claim 3, wherein a difference value between a maximum value and a minimum value of the pulse widths in each region equals to a preset value.

5. The method according to claim 4, wherein the method further comprises:
   judging whether there exists an outer pulse width among the pulse widths marked on the pulse-width coordinate, wherein the outer pulse width is a pulse width locating outside the at least one region;
   selecting a convergence pulse width having a smallest absolute difference value with respect to the outer pulse width when there exists the outer pulse width; and
   replacing the outer pulse width with the convergence pulse width having the smallest absolute difference value with respect to the outer pulse width.

6. The method according to claim 4, wherein calculating the average value of the pulse widths in each region:
   determining the number of the pulse widths in each region;
   calculating the sum of the pulse widths in each region; and
   taking a ratio of the sum against the number as the average value of the pulse widths in each region.

7. The method according to claim 3, wherein the method further comprises:
   judging whether there exists an outer pulse width among the pulse widths marked on the pulse-width coordinate, wherein the outer pulse width is a pulse width locating outside the at least one region;
   selecting a convergence pulse width having a smallest absolute difference value with respect to the outer pulse width when there exists the outer pulse width; and
   replacing the outer pulse width with the convergence pulse width having the smallest absolute difference value with respect to the outer pulse width.

8. The method according to claim 3, wherein calculating the average value of the pulse widths in each region comprises:
   determining the number of the pulse widths in each region;
   calculating the sum of the pulse widths in each region; and
   taking a ratio of the sum against the number as the average value of the pulse widths in each region.

9. The method according to claim 1, wherein determining the convergence pulse width for each of the at least one pulse width group comprises:
   marking each pulse width in the PWM data on a pulse-width coordinate;
   determining at least one region on the pulse-width coordinate, wherein a marking density is equal to or larger than a preset density in each region;
   determining pulse widths in each region as each group of the pulse widths;
   selecting a median value of the pulse widths in each region; and
   replacing the median value as the corresponding convergence pulse width for each of the at least one pulse width group.

10. A device for processing PWM data, comprising:
a processor; and
a memory for storing instructions executable by the processor;
wherein, the processor is configured to perform:
dividing pulse widths in the PWM data into at least one pulse width group;
determining a convergence pulse width for each of the at least one pulse width group, wherein each of the at least one pulse width group converges around a same pulse width, respectively;
replacing each of the at least one pulse width group with the corresponding convergence pulse width; and
representing the PWM data by using the convergence pulse widths.

11. The device according to claim 10, wherein representing the PWM data by using the convergence pulse widths comprises:
generating a pulse-width query table which contains an index for each of the convergence pulse widths; and
representing the PWM data by using the indexes in the pulse-width query table.

12. The device according to claim 10, wherein determining the convergence pulse width for each of the at least one pulse width group comprises:
marking each pulse width in the PWM data on a pulse-width coordinate;
determining at least one region on the pulse-width coordinate, wherein a marking density is equal to or larger than a preset density in each region;
determining pulse widths in each region as each group of the pulse widths;
calculating an average value of the pulse widths in each region; and
replacing the average value as the corresponding convergence pulse width for each of the at least one pulse width group.

13. The device according to claim 12, wherein a difference value between a maximum value and a minimum value of the pulse widths in each region equals to a preset value.

14. The device according to claim 13, wherein the processor is configured to further perform:
judging whether there exists an outer pulse width among the pulse widths marked on the pulse-width coordinate, wherein the outer pulse width is a pulse width locating outside the at least one region;
selecting a convergence pulse width having a smallest absolute difference value with respect to the outer pulse width when there exists the outer pulse width; and
replacing the outer pulse width with the convergence pulse width having the smallest absolute difference value with respect to the outer pulse width.

15. The device according to claim 13, wherein calculating the average value of the pulse widths in each region comprises:
determining the number of the pulse widths in each region;
calculating the sum of the pulse widths in each region; and
taking a ratio of the sum against the number as the average value of the pulse widths in each region.

16. The device according to claim 12, wherein the processor is configured to further perform:
judging whether there exists an outer pulse width among the pulse widths marked on the pulse-width coordinate, wherein the outer pulse width is a pulse width locating outside the at least one region;
selecting a convergence pulse width having a smallest absolute difference value with respect to the outer pulse width when there exists the outer pulse width; and
replacing the outer pulse width with the convergence pulse width having the smallest absolute difference value with respect to the outer pulse width.

17. The device according to claim 12, wherein calculating the average value of the pulse widths in each region comprises:
determining the number of the pulse widths in each region;
calculating the sum of the pulse widths in each region; and
taking a ratio of the sum against the number as the average value of the pulse widths in each region.

18. The device according to claim 10, wherein determining the convergence pulse width for each of the at least one pulse width group comprises:
marking each pulse width in the PWM data on a pulse-width coordinate;
determining at least one region on the pulse-width coordinate, wherein a marking density is equal to or larger than a preset density in each region;
determining pulse widths in each region as each group of the pulse widths;
selecting a median value of the pulse widths in each region; and
replacing the median value as the corresponding convergence pulse width for each of the at least one pulse width group.

19. A non-transitory computer readable storage medium, when instructions in the storage medium are executed by a processor of a device, the device is caused to execute the following steps of:
dividing pulse widths in the PWM data into at least one pulse width group;
determining a convergence pulse width for each of the at least one pulse width group, wherein each of the at least one pulse width group converges around a same pulse width, respectively;
replacing each of the at least one pulse width group with the corresponding convergence pulse width; and
representing the PWM data by using the convergence pulse widths.

20. The non-transitory computer readable storage medium according to claim 19, wherein determining the convergence pulse width for each of the at least one pulse width group comprises:
marking each pulse width in the PWM data on a pulse-width coordinate;
determining at least one region on the pulse-width coordinate, wherein a marking density is equal to or larger than a preset density in each region;
determining pulse widths in each region as each group of the pulse widths;
calculating an average value of the pulse widths in each region; and
replacing the average value as the corresponding convergence pulse width for each of the at least one pulse width group.

* * * * *